(12) United States Patent
Pyo

(10) Patent No.: US 6,344,760 B1
(45) Date of Patent: Feb. 5, 2002

(54) SENSE AMPLIFIER DRIVE CIRCUIT

(75) Inventor: Young Tack Pyo, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/606,902

(22) Filed: Jun. 30, 2000

(30) Foreign Application Priority Data

Jul. 28, 1999 (KR) .......................... 1999-30920

(51) Int. Cl.[7] .......................... G01R 13/00; G11C 7/00; H03F 3/45
(52) U.S. Cl. .......................... 327/51; 327/57; 327/258; 327/296; 365/205; 365/207; 326/81
(58) Field of Search .......................... 327/50, 51, 52, 327/55, 57, 108, 258, 295, 296; 326/80, 81; 365/205, 207

(56) References Cited

U.S. PATENT DOCUMENTS

| | | | | |
|---|---|---|---|---|
| 4,656,612 A | * | 4/1987 | Allan .......................... | 365/203 |
| 5,764,580 A | * | 6/1998 | Suzuki et al. .......................... | 365/205 |
| 6,043,685 A | * | 3/2000 | Lee .......................... | 327/52 |
| 6,088,275 A | * | 7/2000 | Tanaka .......................... | 365/205 |
| 6,104,656 A | * | 8/2000 | Jung .......................... | 365/205 |
| 6,169,698 B1 | * | 1/2001 | Sukegawa et al. .......................... | 365/205 |

* cited by examiner

Primary Examiner—Terry D. Cunningham
Assistant Examiner—Long Nguyen
(74) Attorney, Agent, or Firm—Fleshner & Kim, LLP

(57) ABSTRACT

A sense amplifier drive circuit has a sense amplifier amplifying data carried on a bit line and a bit line bar, a sense amplifier drive unit selectively applying an overdrive voltage or an internal power supply voltage to the sense amplifier, and a control signal generator combining a sense amplifier enable bar signal and a refresh enable signal, and generating control signals to control the sense amplifier drive unit. With the construction, an overdrive voltage is not supplied to the bit line and bit line bar during a refresh operation, and current consumption inevitably occurring during the refresh operation is much reduced.

5 Claims, 7 Drawing Sheets

FIG. 3A SAENB
RELATED ART
FIG. 3B SAP1
RELATED ART
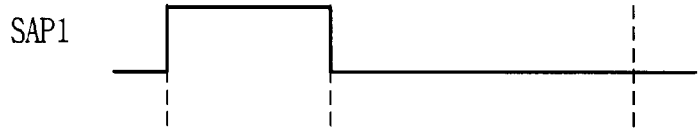
FIG. 3C SAP2
RELATED ART
FIG. 3D SAN
RELATED ART
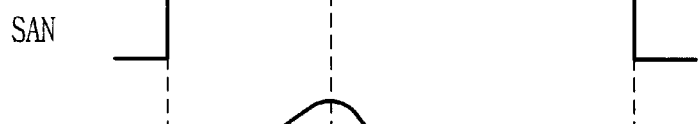
FIG. 3E BL/BLB
RELATED ART
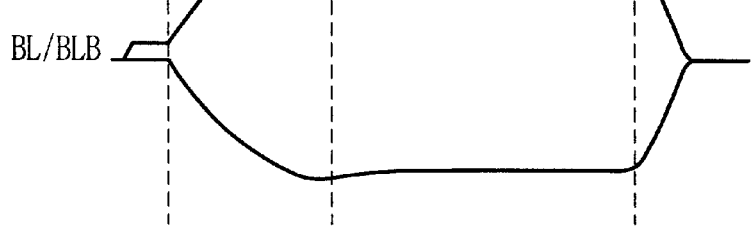

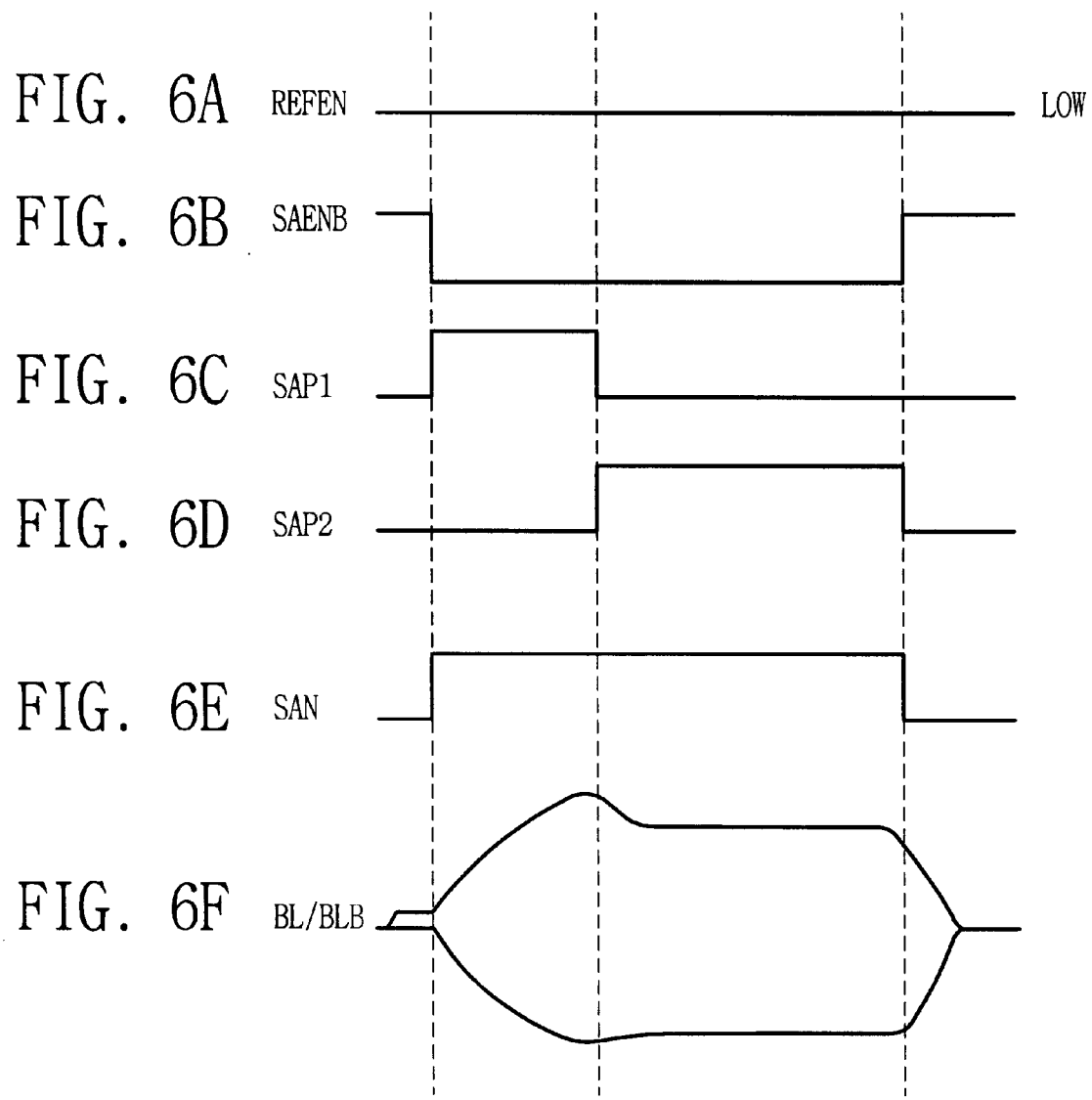

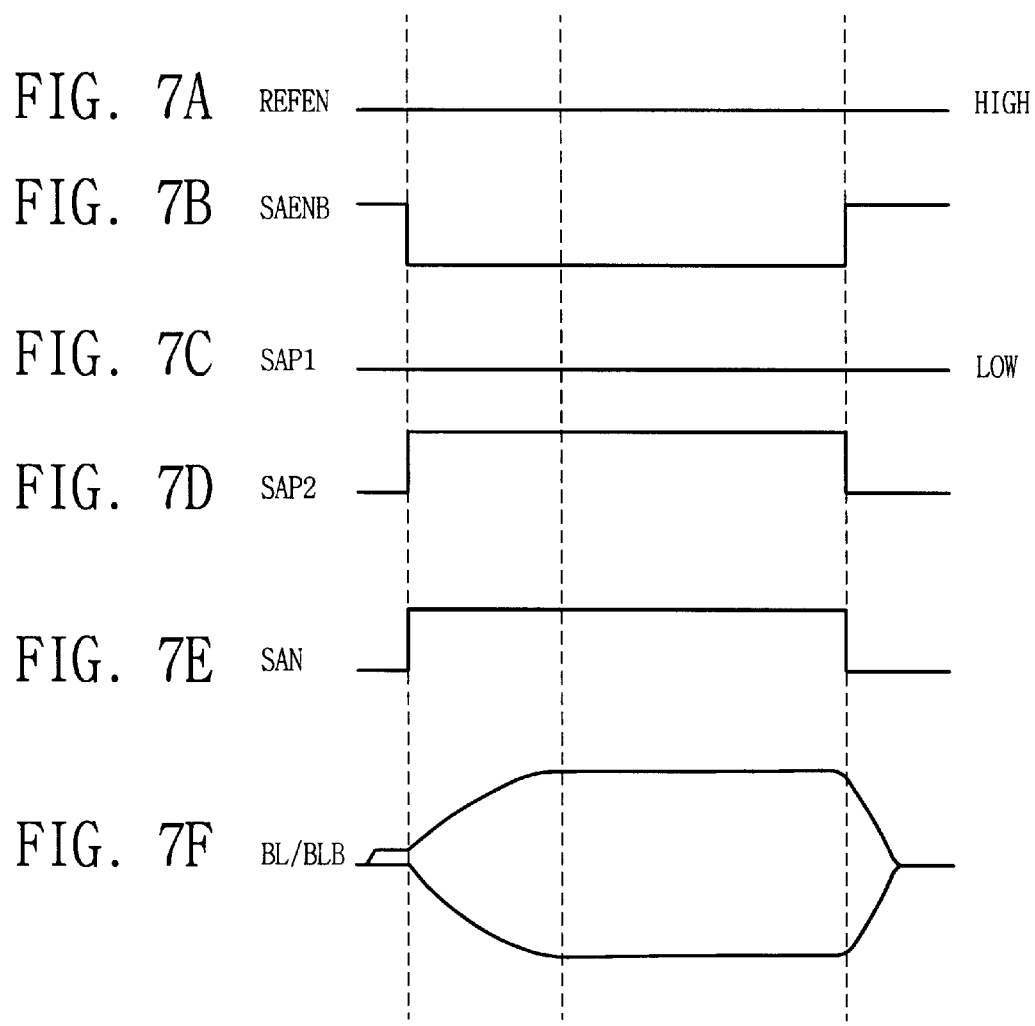

SENSE AMPLIFIER DRIVE CIRCUIT

BACKGROUND OF THE INVENTION

1. Field of the Invention

The present invention relates to a semiconductor device, and more particularly, a sense amplifier drive circuit of a semiconductor memory device and a method for amplifying data.

2. Background of the Related Art

A basic DRAM (Dynamic Random Access Memory) cell structure includes a single transistor and a single capacitor connected to each other. In the DRAM cell, a word line is activated during reading, writing and refreshing operations, and a charge that is stored in the single capacitor of the DRAM cell is carried on a bit line and amplified by a sense amplifier. In this respect, the bit line is precharged before the word line is activated.

When the charge carried on the bit line is amplified by the sense amplifier, the sense amplifier is first overdriven with a pre-set overdrive voltage and is then driven by an internal power supply voltage, for a speedy and easy amplification of the charge.

FIG. 1 illustrates a schematic circuit diagram of a sense amplifier circuit of a related art, and includes a sense amplifier 10 that amplifies a data signal carried on a bit line BL and a bit line bar BLB. A sense amplifier drive unit 20 selectively applies an overdrive voltage or an internal power supply voltage to the sense amplifier 10. A control signal generator 30 generates first and second PMOS control signals SAP1 and SAP2, and an NMOS control signal SAN, to control the sense amplifier drive unit 20.

The sense amplifier 10 is a related art latch-type sense amplifier including a first PMOS transistor PM1 and a first NMOS transistor NM1, connected in series between a PMOS drive line CSP and an NMOS drive line CSN, with their respective gates being commonly connected to a bit line BL via a first node N1. A second PMOS transistor PM2 and a second NMOS transistor NM2 are connected in series between the PMOS drive line CSP and the NMOS drive line CSN, with their respective gates being commonly connected to the bit line bar BLB via a second node N2. Here, the commonly connected drains of the second PMOS transistor PM2 and the second NMOS transistor NM2 serve as the first node N1, while the commonly connected drains of the first PMOS transistor PM1 and the first NMOS transistor NM1 serve as the second node N2.

The sense amplifier drive unit 20 includes a third NMOS transistor NM3 that receives the first control signal SAP1 at its gate and selectively applies an overdrive voltage VDDCLP to the PMOS drive line CSP of the sense amplifier 10. A fourth NMOS transistor NM4 receives the second PMOS control signal SAP2 at its gate and selectively applies an internal power supply voltage VDL to the PMOS drive line CSP of the sense amplifier 10. In addition, a fifth NMOS transistor NM5 receives the NMOS control signal SAN at its gate and selectively connecting the NMOS drive line CSN of sense amplifier 10 to a ground voltage VSS.

FIG. 2 illustrates a detailed schematic circuit diagram of the control signal generator 30 that generates the first and second PMOS control signals SAP1 and SAP2, and the NMOS control signal SAN. As shown in FIG. 2, the control signal generator 30 includes first and second inverters INV1 and INV2, each inverting a sense amplifier enable bar signal SAENB. A delay circuit DE1 delays an output signal from the second inverter INV2 for a predetermined time. A third inverter INV3 inverts an output signal from the delay circuit DE1. A first NOR gate NOR1 provides a NOR operation to an output signal from the third inverter INV3 and the sense amplifier enable bar signal SAENB. A fourth inverter INV4 inverts an output signal from the first inverter INV1, and outputs the inverted output signal to a logic circuit 31. A fifth inverter INV5 inverts an output signal from the first NOR gate NOR1 and outputs the inverted output signal to the logic circuit 31.

The logic circuit 31 includes three control signal generator sections 31a–c, and a sixth inverter INV6 that inverts the output signal from the fifth inverter INV5. The first control signal generator section 31a includes a second NOR gate NOR2 that provides a not OR operation to the output signal from the sixth inverter INV6 and an output signal from the fourth inverter INV4. Seventh and eighth inverters INV7 and INV8 sequentially invert an output signal from the second NOR gate NOR2 as the first PMOS control signal SAP1.

The second control signal generator section 31b includes a ninth inverter INV9 that inverts an output signal from the sixth inverter INV6, and a first NAND gate ND1 that provides a not AND operation to the output signal from the fourth inverter INV4 and an output signal of the ninth inverter INV9. Tenth and eleventh inverters INV10 and INV1-1 sequentially invert an output signal from the first NAND gate ND1 as the NMOS control signal SAN. The third control signal generator section 31c includes twelfth to fifteenth inverters INV12–INV15 that sequentially invert the output signal from the sixth inverter INV6 as the second PMOS control signal SAP2.

FIG. 3 illustrates an operational timing diagram of the related art sense amplifier drive unit of FIG. 1. When the sense amplifier enable bar signal SAENB is applied to the control signal generator 30, the first and second PMOS control signals SAP1 and SAP2 and the NMOS control signal SAN are output to the sense amplifier drive unit 20.

As shown in FIG. 3, the first and the second PMOS control signals SAP1 and SAP2 are sequentially enabled. That is, at the time when the first PMOS control signal SAP1 is disabled after being enabled, the second PMOS control signal SAP2 is enabled. Accordingly, the third and fourth NMOS transistors NM3 and NM4 of the sense amplifier drive unit 20 are sequentially turned on and the overdrive voltage VDDCLP and the internal power supply voltage VDL are sequentially applied to the PMOS drive line CSP of the sense amplifier 10.

In other words, while the first PMOS control signal SAP1 is enabled, the third NMOS transistor NM3 is turned on, and the sense amplifier 10 is driven by the overdrive voltage VDDCLP, so that the data carried on the bit line BL and the bit line bar BLB is amplified to the level of the overdrive voltage VDDCLP.

Subsequently, the first PMOS control signal SAP1 is disabled to turn off the third NMOS transistor NM3,and at this time, the second PMOS control signal SAP2 is enabled to turn on the fourth NMOS transistor NM4. Then, the sense amplifier 10 is driven by the internal power supply voltage VDL, so that the data carried on the bit line BL and the bit line bar BLB is amplified to the level of the internal power supply voltage VDL.

The related sense amplifier drive circuit, however, has a problem that an unnecessary current consumption unavoidably occurs because the overdrive voltage is supplied to the sense amplifier 10 during a refreshing operation.

SUMMARY OF THE INVENTION

An object of the present invention is to substantially obviate one or more of the problems of the related art and provide at least the advantages set forth below.

Another object of the present invention is to reduce an unnecessary current consumption.

Another object of the present invention is to prevent an application of an overdrive voltage during a refresh operation.

The objects of the present invention can be achieved, in whole or in parts, by a sense amplifier drive circuit including a sense amplifier that amplifies data carried on a bit line and a bit line bar; a sense amplifier drive unit that selectively applies an overdrive voltage and an internal power supply voltage to the sense amplifier; and a control signal generator that combines a sense amplifier enable bar signal and a refresh enable signal, and generates control signals to control the sense amplifier drive unit.

The objects of the present invention can also be achieved, in whole or in parts, by a circuit including a control signal generator that receives a sense amplifier signal and a refresh signal, that generates a first set of control signals, based on the sense amplifier signal, when the refresh signal is at a first level, and that generates a second set of control signals, based on the sense amplifier signal, when the refresh signal is at a second level. The circuit also includes a first drive circuit coupled to the control signal generator, that enable the application of a first voltage according the first and second set of control signals, and a second drive circuit, coupled to the control signal generator, that enables the application of a second voltage according to the first set of control signals and disables the application of the second voltage according to the second set of control signals.

The objects of the present invention can further be achieved, in a whole or in parts, by a method for amplifying data, including receiving a sense amplifier signal and a refresh signal, generating a first set of control signals, based on the sense amplifier signal, when the refresh signal is at a first level, generating a second set of control signals, based on the sense amplifier signal, when the refresh signal is at a second level, enabling an application of a first voltage to the data according to the first and second set of control signals, enabling an application of a second voltage to the data according to the first set of control signals, and disabling an application of a second voltage according to the second set of control signals.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 3 illustrates operational timing diagrams of the related art sense amplifier drive circuit;

FIGS. 6 illustrates operational timing diagrams of a sense amplifier drive circuit in accordance with a preferred embodiment of the present invention; and FIG. 7 illustrates refresh operational timing diagrams of a sense amplifier drive circuit in accordance with a preferred embodiment of the present invention.

DETAILED DESCRIPTION OF PREFERRED EMBODIMENTS

Figure 1:
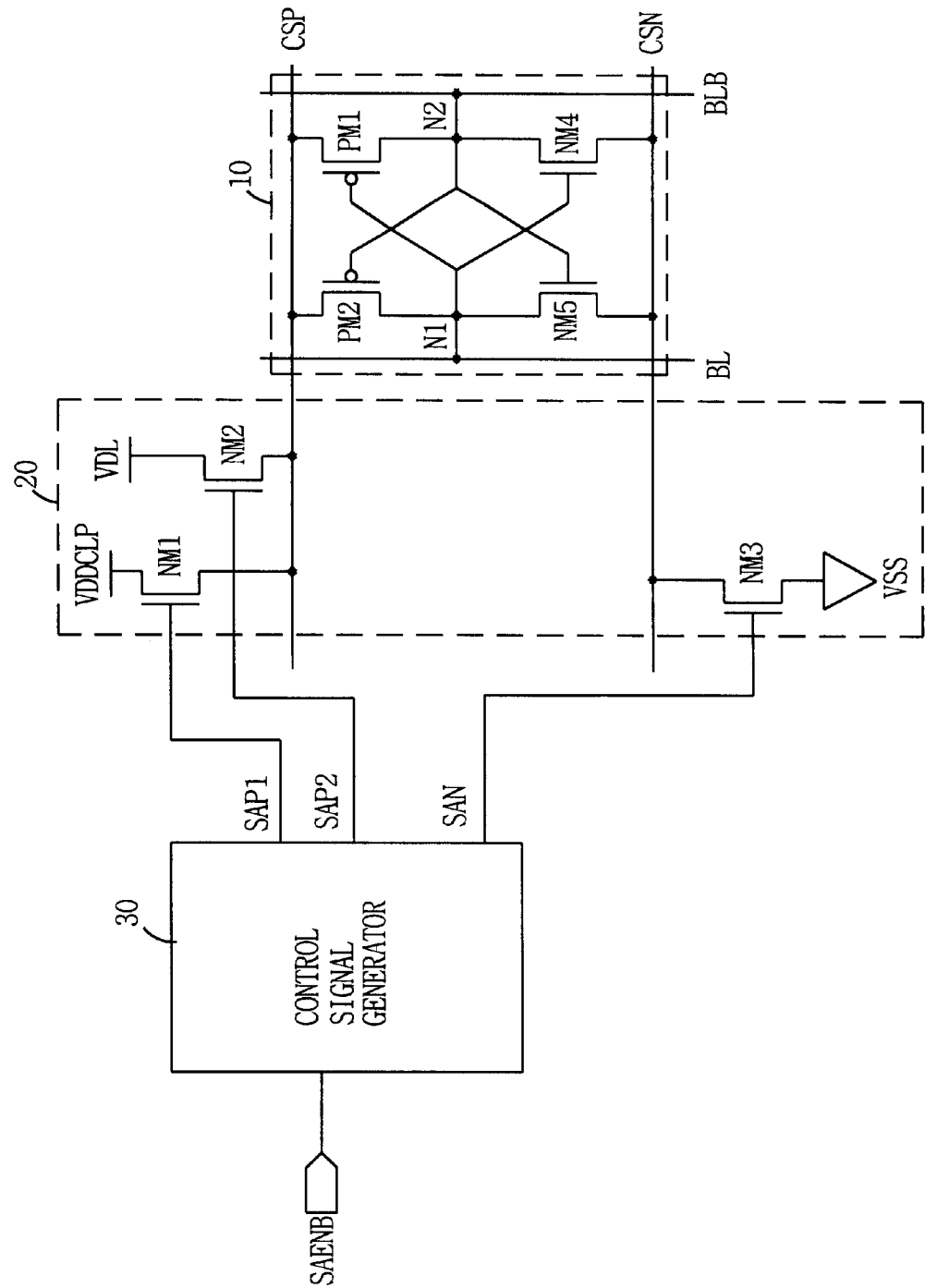
FIG. 1 is a schematic block diagram of a related art sense amplifier drive circuit.
Figure 2:
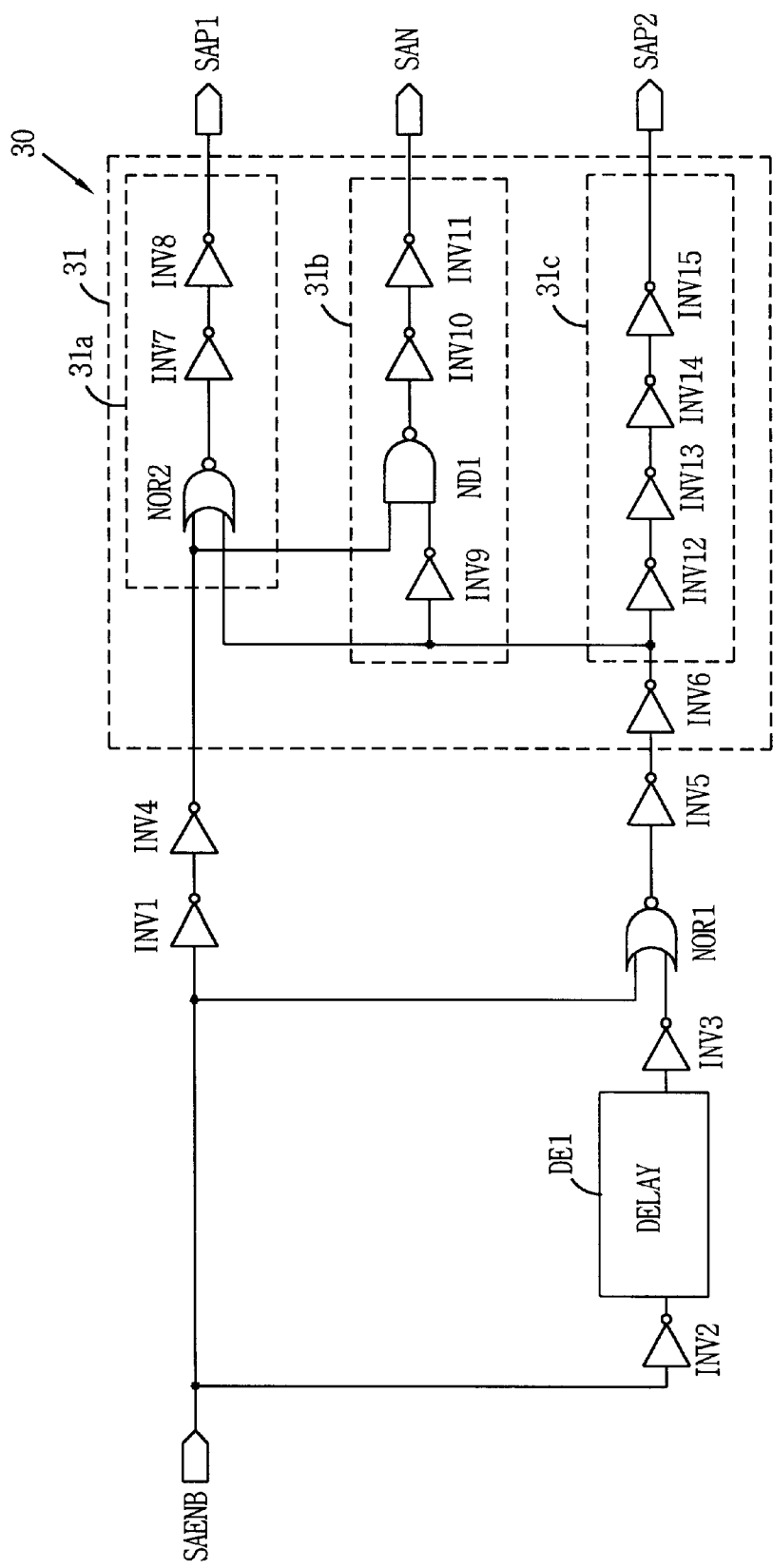
FIG. 2 is a detailed schematic circuit diagram of a related art control signal generator shown in FIG. 1.
Figure 4:
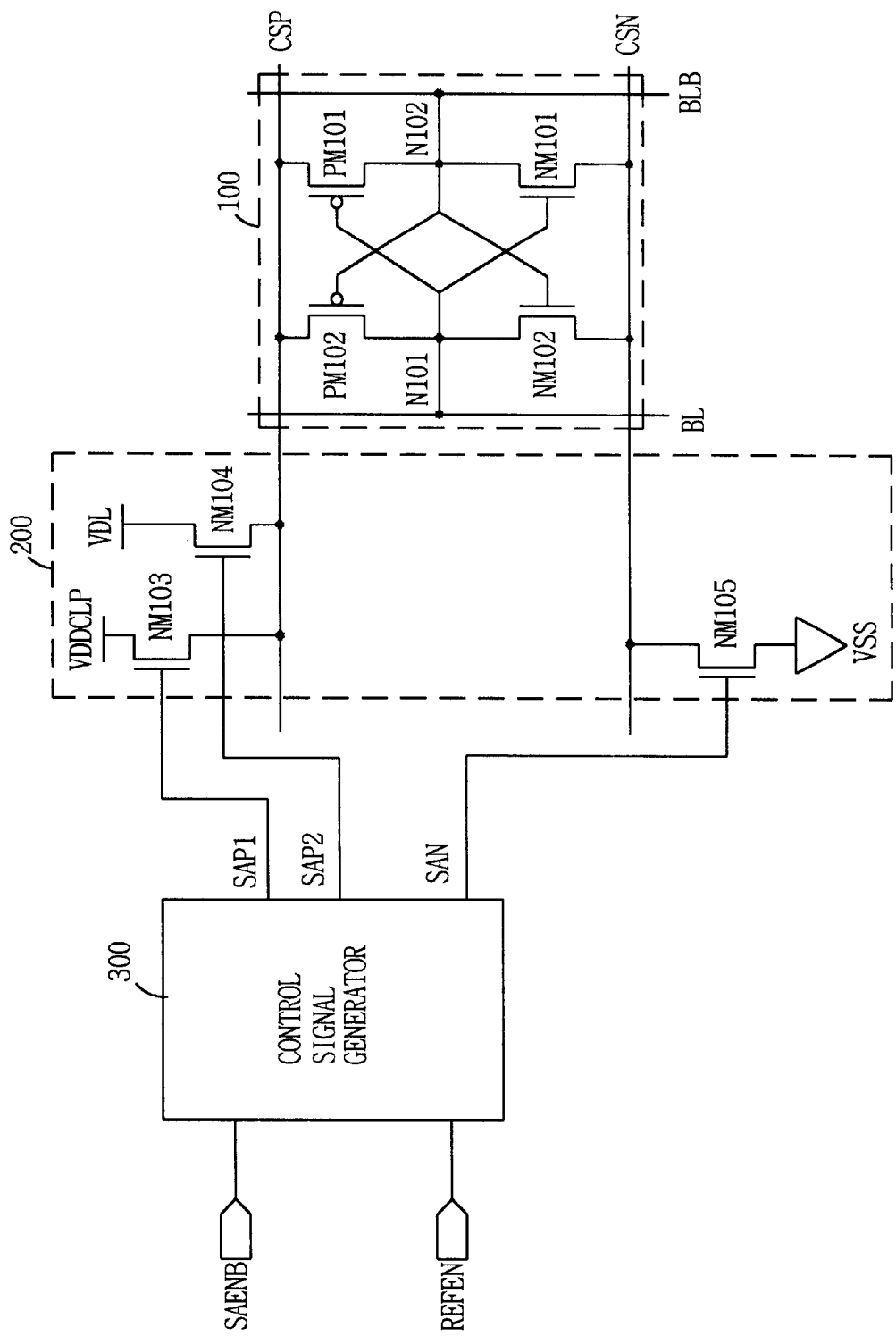
FIG. 4 is a schematic block diagram of a sense amplifier drive circuit in accordance with a preferred embodiment of the present invention.

FIG. 4 is a schematic block diagram of a sense amplifier drive circuit in accordance with a preferred embodiment of the present invention, which includes a sense amplifier 100, a sense amplifier drive unit 200, and a control signal generator 300.

The sense amplifier 100, preferably a latch-type sense amplifier, includes respective first PMOS and NMOS transistors PM101 and NM101 being connected in series between a PMOS drive line CSP and an NMOS drive line CSN, with their respective gates being commonly connected to a bit line BL via a first node N101. Respective second PMOS and NMOS transistors PM102 and NM102 are connected in series between the PMOS drive line CSP and the NMOS drive line CSN, with their respective gates being commonly connected to a bit line bar BLB via a second node N102. In this example of the preferred embodiment, the commonly connected drains of the second PMOS transistor PM102 and the second NMOS transistor NM102 define the first node N101, while the commonly connected drains of the first PMOS transistor PM101 and the first NMOS transistor NM101 define the second node N102. The sense amplifier 100 amplifies data carried on the bit line BL and the bit line bar BLB.

The sense amplifier drive unit 200 includes a third NMOS transistor NM 103 that receives the first PMOS control signal SAP1 at its gate and selectively applies an overdrive voltage VDDCLP to the PMOS drive line CSP. A fourth NMOS transistor NM104 receives the second PMOS control signal SAP2 at its gate and selectively applies the internal power supply voltage VDL to the PMOS drive line CSP. A fifth NMOS transistor NM105 receives the NMOS control signal SAN at its gate and selectively connects the NMOS drive line CSN with a ground voltage VSS. The sense amplifier drive unit 200 selectively applies the overdrive voltage VDDCLP or the internal power supply voltage VDL to the sense amplifier.

Figure 5:
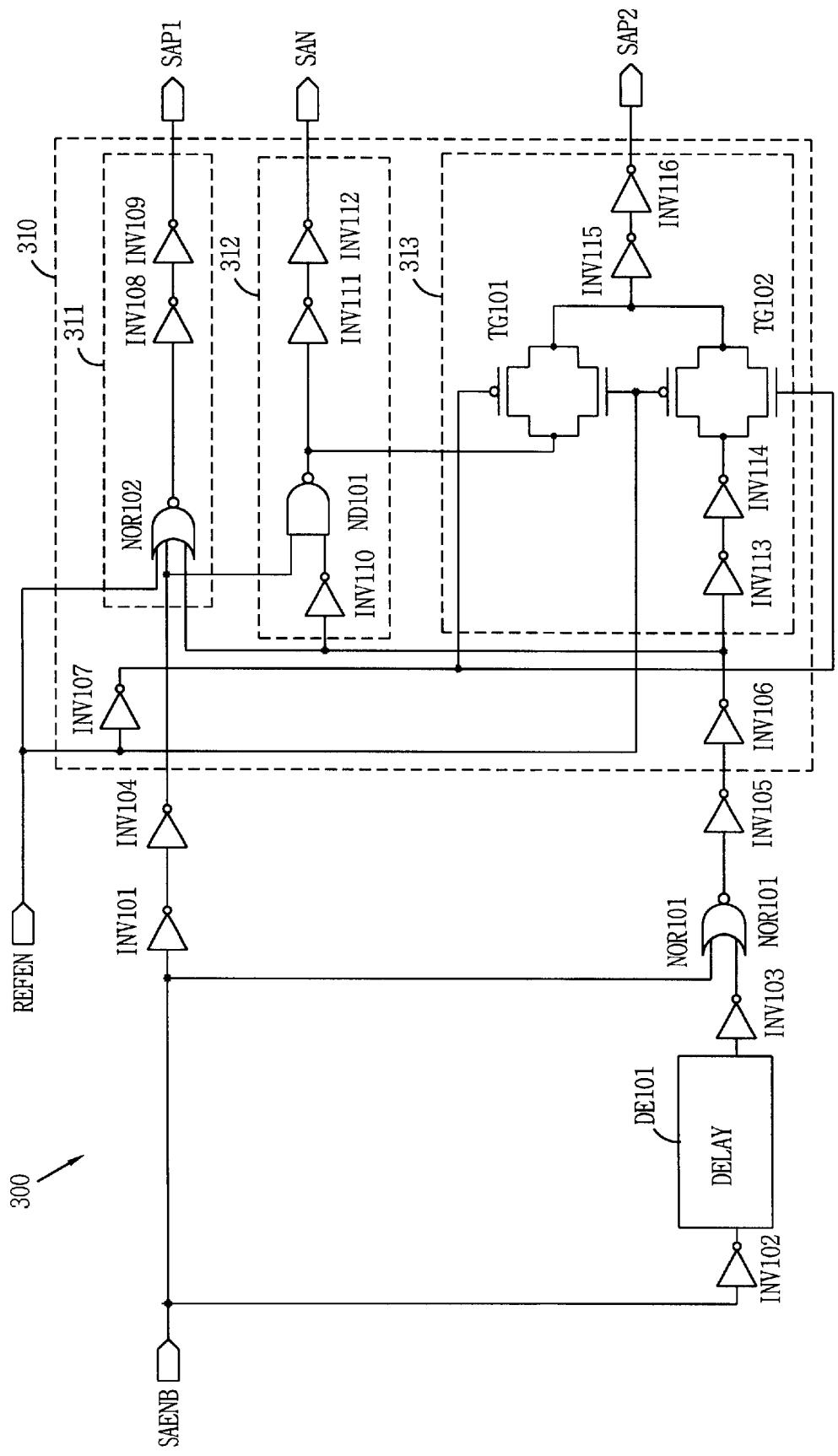
FIG. 5 is a detailed schematic circuit diagram of a control signal generator, as shown, for example, in the sense amplifier drive circuit of FIG. 4.

FIG. 5 is a detailed schematic circuit diagram of the control signal generator 300 that receives a sense amplifier enable bar signal SAENB and a refresh enable signal REFEN, and generates the first and second PMOS control signals SAP1 and SAP2 and the NMOS control signal SAN to control the sense amplifier drive unit 100. The control signal generator 300, of the preferred embodiment of the present invention, includes first and second inverters INV101 and INV102, each inverting the sense amplifier enable bar signal SAENB. A delay circuit DE101 delays an output signal from the second inverter INV102 for a predetermined time. A third inverter INV103 inverts an output signal from the delay circuit DE101 to a first NOR gate NOR101, which performs a not OR operation on an output signal from the third inverter INV103 and the sense amplifier enable bar signal SAENB. A fourth inverter INV104 inverts an output signal from the first inverter INV101, and a fifth inverter INV105 inverts an output signal from the first NOR gate NOR101 and outputs the inverted output signal to a logic circuit 310.

The logic circuit 310 includes a sixth inverter INV106, that inverts an output signal from the fifth inverter INV105, a seventh inverter INV107, that inverts the refresh enable signal REFEN, and first, second, and third control signal generator sections 311, 312, and 313, respectively.

The first control signal generator section 311 logically combines an output signal from the fourth inverter INV104, an output signal from the sixth inverter INV106, and a refresh enable signal REFEN, and outputs the first PMOS control signal SAP1. The first control signal generator section 311 includes a second NOR gate NOR102, that performs a not OR operation on the output signal from the fourth inverter INV104, the output signal from the sixth inverter INV106, and the refresh enable signal REFEN. The first control signal generator section 311 also includes eighth and ninth inverters INV108 and INV109 that sequentially invert an output signal from the second NOR gate NOR102, and outputs the first PMOS control signal SAP1.

The second control signal generator section 312 logically combines the output signal from the fourth inverter INV104 and the inverted output signal of the sixth inverter INV106, and outputs the NMOS control signal SAN. The second control signal generator section 312 includes a first NAND gate ND101 that performs a not AND operation on the output signal from the fourth inverter INV104, and the tenth inverter INV110 that inverts the output signal from the sixth inverter INV106. The second control signal generator section 312 also includes eleventh and twelfth inverters INV111 and INV112 that sequentially invert an output signal from the first NAND gate ND101, and outputs the NMOS control signal SAN.

The third control signal generator section 313 selectively outputs an output signal from the sixth inverter INV106 or an output signal from the second control signal generator 312, and outputs the second PMOS control signal SAP2. The third control signal generator section 313 includes thirteenth and fourteenth inverters INV113 and INV114 that sequentially invert the output signal from the sixth inverter INV106. A first transmission gate TG101 selectively transmits an output signal from the fourteenth inverter INV114, under the control of the refresh enable signal REFEN and an output signal from the seventh inverter INV107. A second transmission gate TG102 selectively transmits an output signal from the fourteenth inverter INV114, under the control of the refresh enable signal REFERN and the output signal from the seventh inverter INV107. Fifteenth and sixteenth invert INV115 and INV116 sequentially invert the signal selectively transmitted by the first and the second transmission gates TG101 and TG102, and output the second PMOS control signal SAP2.

The operation of the sense amplifier drive circuit in accordance with a preferred embodiment of the present invention will be explained with reference to FIGS. 5, 6a to 6f and 7a to 7f.

When the refresh control signal REFEN is in a disabled state, for example, at a low level, the signal outputs of the sense amplifier 100, the sense amplifier drive unit, and the control signal generator 300 are substantially similar to the signal outputs of the sense amplifier 10, the sense amplifier drive unit 20 and the control signal generator 30 of the related art, as shown by comparison of FIGS. 3 and 6. In other words, as shown in FIG. 6b, when the sense amplifier enable bar signal SAENB is applied, the first and the second PMOS control signals SAP1 and SAP2, and the NMOS control signal SAN, shown in FIGS. 6c to 6e, are respectively outputted by the first, second, and third control signal generator sections 311, 312 and 313 of the control signal generator 300. The first and the second PMOS control signals SAP1 and SAP2 are sequentially enabled, because when the first PMOS control signal SAP1 is disabled after being enabled, the second PMOS control SAP2 is enabled. Accordingly, the NMOS transistors NM103 and NM104 of the sense amplifier drive unit 200 are sequentially turned on, and thus the overdrive voltage VDDCLP and the internal power supply voltage VDL are sequentially applied to the sense amplifier 100 via the PMOS drive line CSP.

While the first PMOS control signal SAP1 is enabled, the NMOS transistor NM103 is turned on, and the sense amplifier 100 is driven by the overdrive voltage VDDCLP, so that the data carried on the bit line BL and the bit line bar BLB is amplified to the level of the overdrive voltage VDDCLP. Subsequently, the first PMOS control signal SAP1 is disabled to turn off the NMOS transistor NM103, and at this time, the second PMOS control signal SAP2 is enabled to turn on the NMOS transistor NM104. Accordingly, the PMOS drive line CSP of the sense amplifier 100 is driven by the internal power supply voltage VDL, so that the data carried on the bit line BL and the bit line bar BLB is amplified to the level of the internal power supply voltage VDL.

On the other hand, as shown in FIGS. 5, 7a and 7b, when the refresh enable signal REFEN is in an enabled state, for example, at a high level, the first control signal generator section 311 of the logic circuit 310 generates a low level first PMOS control signal SAP1. Therefore, the NMOS transistor NM103 is turned off, and the overdrive voltage is not supplied to the PMOS drive line CSP.

Also, since the refresh enable signal REFEN is at a high level, the first transmission gate TG101 is turned on, and the output signal from the first NAND gate ND101 is sequentially inverted by the fifteenth and the sixteenth inverters INV15 and INV16, to output the second PMOS control signal SAP2, as shown in FIG. 7d. Here, the second PMOS control signal SAP2 is the same signal as the NMOS control signal SAN. Accordingly, when the refresh enable signal REFEN is at a high level, and the sense amplifier enable bar signal SAENB is at a low level, the NMOS transistors NM104 and NM105 are turned on, so that the PMOS drive line CSP of sense amplifier 100 is driven by the internal power supply voltage VDL, to amplify the data carried on the bit line BL and the bit line bar BLB. However, since the overdrive voltage is not supplied to the PMOS drive line CSP during refreshing, the current consumption inevitably occurring during this operation is reduced.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A sense amplifier drive circuit comprising:
   a sense amplifier that amplifies data carried on a bit line and a bit line bar;
   a sense amplifier drive unit that selectively applies an overdrive voltage or an internal power supply voltage to the sense amplifier; and
   a control signal generator that logically combines a sense amplifier enable bar signal and a refresh enable signal, and generates a plurality of control signals to control the sense amplifier drive unit for read, write, and refresh operations, wherein said plurality of control signals prevent application of the overdrive voltage during the refresh operation, wherein the signal generator comprises:

first and second inverters, each that inverts the sense amplifier enable bar signal;

a delay circuit that delays an output signal from the second inverter for a predetermined time;

a third inverter that inverts an output signal from the delay circuit;

a first NOR gate that performs a NOR operation to a combination of an output signal from the third inverter and the sense amplifier enable bar signal;

a fourth inverter that inverts an output from the second inverter;

a fifth inverter that inverts an output signal from the first NOR gate; and a logic circuit that logically combines an output signal from the fourth inverter, an output signal from the fifth inverter and the refresh enable signal, to output the plurality of control signals.

2. The circuit of claim 1, wherein the logic circuit includes:

a sixth inverter that inverts the output signal from the fifth inverter;

a seventh inverter that inverts the refresh enable signal;

a first control signal generator section that combines the output signal from the fourth inverter, an output signal from the sixth inverter and the refresh enable signal, and outputs a first one of the control signals;

a second control signal generator section that combines the output signal from the fourth inverter and the output signal from the sixth inverter, and outputs a second one of the control signals; and a third control signal generator section that selectively outputs the output signal from the sixth inverter or the second control signal output from the second control signal generator section, and outputs a third one of the control signals.

3. The circuit of claim 2, wherein the first control signal generator section includes:

a second NOR gate that performs a NOR operation on the output signal from the fourth inverter, the output signal from the sixth inverter, and the refresh enable signal; and eighth and ninth inverters positioned in series that sequentially invert an output signal from the second NOR gate, and output the first control signal.

4. The circuit of claim 2, wherein the second control signal generator section includes:

a tenth inverter that inverts the output signal from the sixth inverter;

a first NAND gate that performs a NAND operation on the output signal from the fourth inverter and an output signal from the tenth inverter; and eleventh and twelfth inverters positioned in series, that sequentially invert an output signal from the first NAND gate, and output the second control signal.

5. The circuit of claim 4, wherein the third control signal generator section includes:

thirteenth and fourteenth inverters positioned in series, that sequentially invert the output signal from the sixth inverter;

a first transmission gate that selectively transmits an output signal from the first NAND gate under the control of the refresh enable signal and the output signal from the seventh inverter;

a second transmission gate that selectively transmits an output signal from the fourteenth inverter under the control of the refresh enable signal and the output signal from the seventh inverter; and fifteenth and sixteenth inverters positioned in series that sequentially invert the signal selectively transmitted by the first and second transmission gates, and output the third control signal.

* * * * *